United States Patent
Kang et al.

(10) Patent No.: US 11,309,026 B2
(45) Date of Patent: Apr. 19, 2022

(54) CONVOLUTION OPERATION METHOD BASED ON NOR FLASH ARRAY

(71) Applicant: PEKING UNIVERSITY, Beijing (CN)

(72) Inventors: Jinfeng Kang, Beijing (CN); Peng Huang, Beijing (CN); Runze Han, Beijing (CN); Xiaoyan Liu, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 570 days.

(21) Appl. No.: 16/326,946

(22) PCT Filed: Jan. 25, 2017

(86) PCT No.: PCT/CN2017/072625
§ 371 (c)(1),
(2) Date: Feb. 21, 2019

(87) PCT Pub. No.: WO2018/137177
PCT Pub. Date: Aug. 2, 2018

(65) Prior Publication Data
US 2021/0287745 A1    Sep. 16, 2021

(51) Int. Cl.
*G11C 16/04*    (2006.01)
*G11C 16/10*    (2006.01)

(52) U.S. Cl.
CPC ............. *G11C 16/04* (2013.01); *G11C 16/10* (2013.01)

(58) Field of Classification Search
CPC .................................................. G11C 16/04
See application file for complete search history.

(56) References Cited

U.S. PATENT DOCUMENTS

| 10,915,248 B1* | 2/2021 | Lung ..................... G06F 3/0679 |
| 2005/0169081 A1* | 8/2005 | Honda ..................... G11C 7/12 |
| | | 365/210.1 |
| 2012/0155177 A1* | 6/2012 | Wang ..................... G11C 16/28 |
| | | 365/185.17 |

(Continued)

FOREIGN PATENT DOCUMENTS

| CN | 106228240 A | 12/2016 |
| CN | 106250103 A | 12/2016 |
| CN | 106250939 A | 12/2016 |

OTHER PUBLICATIONS

International Search Report dated Nov. 8, 2017 issued in PCT/CN2017/072625.

*Primary Examiner* — Douglas King
(74) *Attorney, Agent, or Firm* — Scully Scott Murphy & Presser (57) ABSTRACT

The present disclosure relates to the field of semiconductor integrated circuits and manufacturing technologies thereof, and discloses a method and device for realizing a convolution operation based on an NOR flash storage structure. The NOR flash array has a structure of an array composed of a plurality of NOR flash cells. The convolution operation method includes: storing elements of a convolution kernel matrix into the NOR flash cells; converting elements of an input matrix into voltages and applying the voltages to gate terminals of the NOR flash cells; applying a driving voltage to source terminals of the NOR flash cells; and collecting, via drain terminals of the NOR flash cells, current values of each column to obtain a convolution operation result.

11 Claims, 4 Drawing Sheets

(56) References Cited

U.S. PATENT DOCUMENTS

| | | | |
|---|---|---|---|
| 2012/0212989 A1* | 8/2012 | Yu | H01L 27/10882 |
| | | | 365/51 |
| 2015/0309961 A1 | 10/2015 | Ozaki et al. | |
| 2017/0337466 A1* | 11/2017 | Bayat | G06F 3/0655 |
| 2020/0192970 A1* | 6/2020 | Ma | G06N 3/0445 |
| 2020/0285954 A1* | 9/2020 | Li | G06N 3/0454 |
| 2021/0192325 A1* | 6/2021 | Hoang | G06F 7/523 |

* cited by examiner

CONVOLUTION OPERATION METHOD BASED ON NOR FLASH ARRAY

TECHNICAL FIELD

The present disclosure belongs to the field of semiconductor integrated circuits and manufacturing technologies thereof, and more particularly, to a convolution operation method and device based on an NOR flash array.

BACKGROUND

Convolution operations, as a kind of linear operations, play a very important role in terms of signals and systems, and are widely applied in systems for image recognition, seismic survey, ultrasonic diagnosis, artificial intelligence etc. Convolution operations in these systems are characterized by a large computational complexity, a large data throughput, and a fixed computational method etc. If conventional general-purpose processors, such as Central Processing Units (CPUs), are used for convolution calculation, it may cause low computational efficiency and a slow speed, which cannot meet the requirements of real-time data processing. If a scheme of implementing convolution by using a Graphic Processing Unit (GPU) is used, it also has a problem of a large number of hardware overhead resources. In recent years, artificial intelligence has developed rapidly, and demands for convolution operations have increased dramatically. Therefore, there is a need to develop an efficient convolution operation method.

SUMMARY

In order to at least partially solve or alleviate the above problems, the present disclosure proposes a method capable of implementing an efficient convolution operation based on an NOR flash structure, which can realize multiplication calculation using an NOR flash array, realize a convolution operation by using an NOR flash array and realize parallel execution of convolution operations by using an NOR flash array.

A convolution operation method based on an NOR flash array is provided, the NOR flash array being a two-dimensional array composed of a plurality of NOR flash cells, the method comprising:

storing elements of a convolution kernel matrix into the NOR flash cells;

applying voltages corresponding to elements of an input matrix to gate terminals of the NOR flash cells while applying a driving voltage to source terminals of the NOR flash cells, such that currents are output, at drain terminals of the NOR flash cells; and determining a convolution operation result based on output currents from the drain terminals of the NOR flash cells.

In one or more embodiments, the storing of elements of a convolution kernel matrix into the NOR flash cells comprises: applying voltages corresponding to the elements of the convolution kernel matrix to the gate terminals, the source terminals, and the drain terminals of the NOR flash cells via word lines, a common source line, and bit lines, respectively, to write the elements of the convolution kernel matrix into the NOR flash cells.

In one or more embodiments, if the element of convolution kernel matrix is 1 or −1, the corresponding NOR flash cell is programmed to low threshold voltage; and if the element of the convolution kernel matrix is 0, the corresponding NOR flash cell is programmed to high threshold voltage.

In one or more embodiments, to convert the elements of the input matrix into voltages, the voltages corresponding to elements of an input matrix are applied to gate terminals of the NOR flash cells via word lines, while a driving voltage is applied to source terminals of the NOR flash cells via a common source line.

In one or more embodiments, if the element of the input matrix is 1, the corresponding voltage applied to the gate terminal of NOR flash cell is the half of a sum of a high threshold voltage and a low threshold voltage of NOR flash cell; if the element of the input matrix is 0, the corresponding voltage applied to the gate terminal of NOR flash cell is 0.

In one or more embodiments, the determining of a convolution operation result based on output currents from the drain terminals of the NOR flash cells comprises: aggregating the output currents from the drain terminals of the NOR flash cells to operational amplifiers via bit lines, wherein values from output terminals of the operational amplifiers constitute an output matrix to determine the convolution operation result.

In one or more embodiments, output currents from drain terminals of NOR flash cells connected to a positive bit line are input to a positive input terminal of a corresponding operational amplifier, output currents from drain terminals of NOR flash cells connected to a negative bit line are input to a negative input terminal of the operational amplifier, and a value from an output terminal of the operational amplifier is an element of the output matrix.

In one or more embodiments, the NOR flash array further comprises a plurality of word lines, a plurality of bit lines, and a common source line, wherein gate terminals of each row of NOR flash cells are connected via a corresponding word line, drain terminals of each column of NOR flash cells are connected via a corresponding bit line, and source terminals of all the NOR flash cells are connected via one common source line.

In one or more embodiments, the NOR flash array further comprises: a plurality of source lines, wherein source terminals of each row of NOR flash cells being connected via a corresponding source line, and each of the source lines is connected to the common source line.

In one or more embodiments, the input matrix has a size of m×m, the convolution kernel matrix has a size of n×n, and the obtained output matrix has a size of (m−n+1)×(m−n+1).

A convolution operation device is provided. The method comprises: an NOR flash array which is a two-dimensional array composed of a plurality of NOR flash cells, and a plurality of operational amplifiers, wherein each of the NOR flash cells has a gate terminal, a source terminal, and a drain terminal, the gate terminals of the NOR flash cells in a same row of the NOR flash array being connected to a same word line, the drain terminals of the NOR flash cells in a same column of the NOR flash array being connected to a same bit line, and the source terminals of all the NOR flash cells being connected to a common source line, wherein each of the operational amplifiers has a positive input terminal connected to a positive bit line and a negative input terminal connected to a negative bit line.

In one or more embodiments, the convolution operation device is operative to perform the above convolution operation method.

BRIEF DESCRIPTION OF THE DRAWINGS

The accompanying drawings are intended to provide a further understanding of the present disclosure and constitute a part of the specification. The accompanying drawings are used to explain the present disclosure together with specific implementations below, and are not intended to limit the present disclosure. In the accompanying drawings.

DETAILED DESCRIPTION

In order to make the purposes, technical solutions and advantages of the present disclosure more apparent and obvious, the present disclosure will be further described in detail below in conjunction with specific embodiments with reference to the accompanying drawings.

The technical solutions in the embodiments of the present disclosure will be clearly and completely described below with reference to the accompanying drawings in the embodiments of the present disclosure. It is obvious that the embodiments described are only a part of the embodiments of the present disclosure, but not all the embodiments. All other embodiments obtained by those of ordinary skill in the art based on the embodiments of the present disclosure without any creative work fall within the protection scope of the present disclosure.

Figure 1:
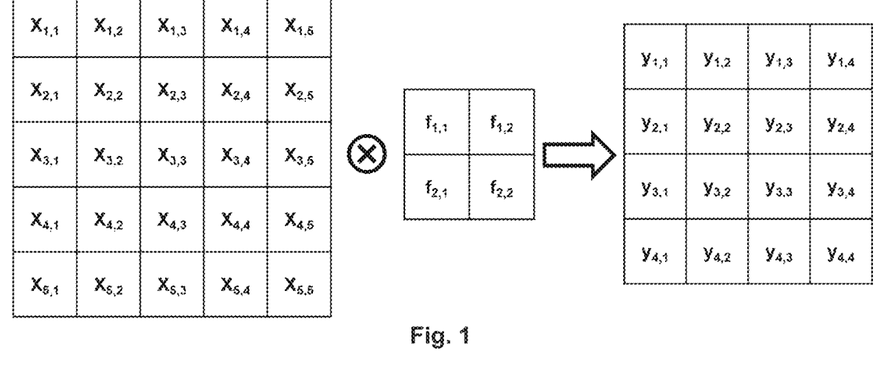
FIG. 1 is a schematic diagram of a matrix convolution operation principle.

Convolution is a generalized concept of integration, which is widely used in fields such as digital signal processing, probability theory, image processing etc. FIG. 1 is a schematic diagram of a calculation process of obtaining a 4×4 output matrix by processing a 5×5 input matrix using a 2×2 convolution kernel matrix. Elements in the input matrix are represented by $x_{i,j}$, and are $x_{1,1} \sim x_{5,5}$, elements in the convolution kernel matrix are represented by $f_{i,j}$, and are $f_{1,1} \sim f_{2,2}$, and elements in the output matrix are represented by $y_{i,j}$, and are $y_{1,1} \sim y_{4,4}$. Firstly, the convolution kernel matrix is flipped, that is, rotated by 180 degrees. Then, the flipped convolution kernel matrix is firstly overlapped with an upper left portion of the input matrix, and then a sum of products of corresponding elements in the overlapping portions is calculated as a first output result, i.e., an element $y_{1,1}$ in the output matrix, which is equal to $x_{1,1} \cdot f_{2,2} + x_{1,2} \cdot f_{2,1} + x_{2,1} \cdot f_{1,2} + x_{2,2} \cdot f_{1,1}$. Subsequently, the flipped convolution kernel matrix is shifted to the right by one bit in an x direction (row direction), and a sum of products of overlapping portions continues to be calculated as a next output result, until all elements in the x direction are overlapped. Then, the convolution kernel matrix is shifted by one bit in a y direction (column direction) and shifted in the x direction to a starting point in the x direction for calculation. The above process is repeated until the elements in the input matrix are all covered by the convolution kernel matrix. An element $y_{i,j}$ in the output matrix may be represented by a formula $y_{i,j} = x_{i,j} \cdot f_{2,2} + x_{i,j+1} \cdot f_{2,1} + x_{i+1,j} \cdot f_{1,2} + x_{i+1,j+1} \cdot f_{1,1}$. As a result, 16 output results may be obtained, and therefore the output matrix has a size of 4×4. For an m×m input matrix, after a convolution operation is performed on the input matrix using an n×n convolution kernel matrix (m>n), an output matrix obtained has a size of (m−n+1)×(m−n+1).

The present disclosure aims to provide a method and device for performing a convolution operation using an NOR flash array. The NOR flash array comprises a plurality of NOR flash cells. A threshold voltage of each of the NOR flash cells may be changed through a PROGRAM/ERASE operation to store a different logic value. When the PROGRAM operation is performed, electrons of an NOR flash substrate may pass through a tunneling layer into a floating gate layer under the control of a gate voltage, thereby causing the threshold voltage of the NOR flash cell to increase; and when the ERASE operation is performed, the electrons may exit from the floating gate layer or holes may enter the floating gate layer under the control of the gate voltage, and at this time, the threshold voltage would decrease.

Figure 2:
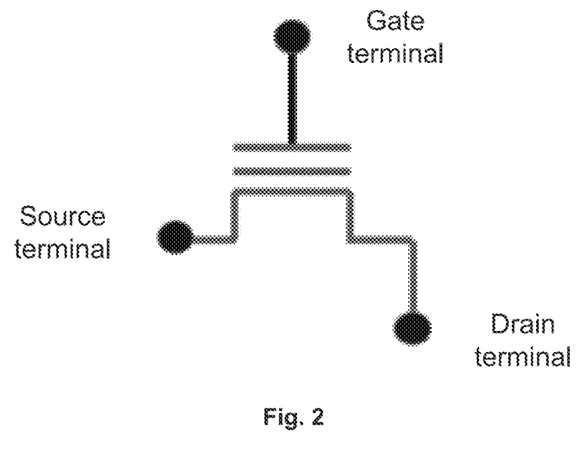
FIG. 2 is a schematic diagram of an NOR flash cell according to an embodiment of the present disclosure.

There are a large number of multiplication operations in the convolution operation. FIG. 2 illustrates a three-terminal NOR flash cell, including a gate terminal, a drain terminal and a source terminal. Firstly, how to perform a multiplication operation using an NOR flash cell will be described with reference to FIG. 2. The threshold voltage of the NOR flash cell can be written to a high threshold voltage (Vth_high) or a low threshold voltage (Vth_low) through an ERASE or PROGRAM operation. For a binary operation of A×B (A is an element in a convolution kernel matrix, that is, a multiplier, and B is an element in an input matrix, that is, a multiplicand), a value of A may be written into the NOR flash cell through a PROGRAM or ERASE operation, and a value of B is converted into a voltage to be applied to the gate terminal in a process of the operation. The values of A and B together determine the state of the NOR flash cell. A voltage is applied to the source terminal of the NOR flash cell. Different current values may be obtained according to the states of NOR flash cells. Current at drain terminals corresponding to each column of NOR flash cells may be collected to obtain a result of the multiplication operation. The flash cell here may be a conventional flash memory or may also be a new type of charge trapping flash memory.

Figure 3:
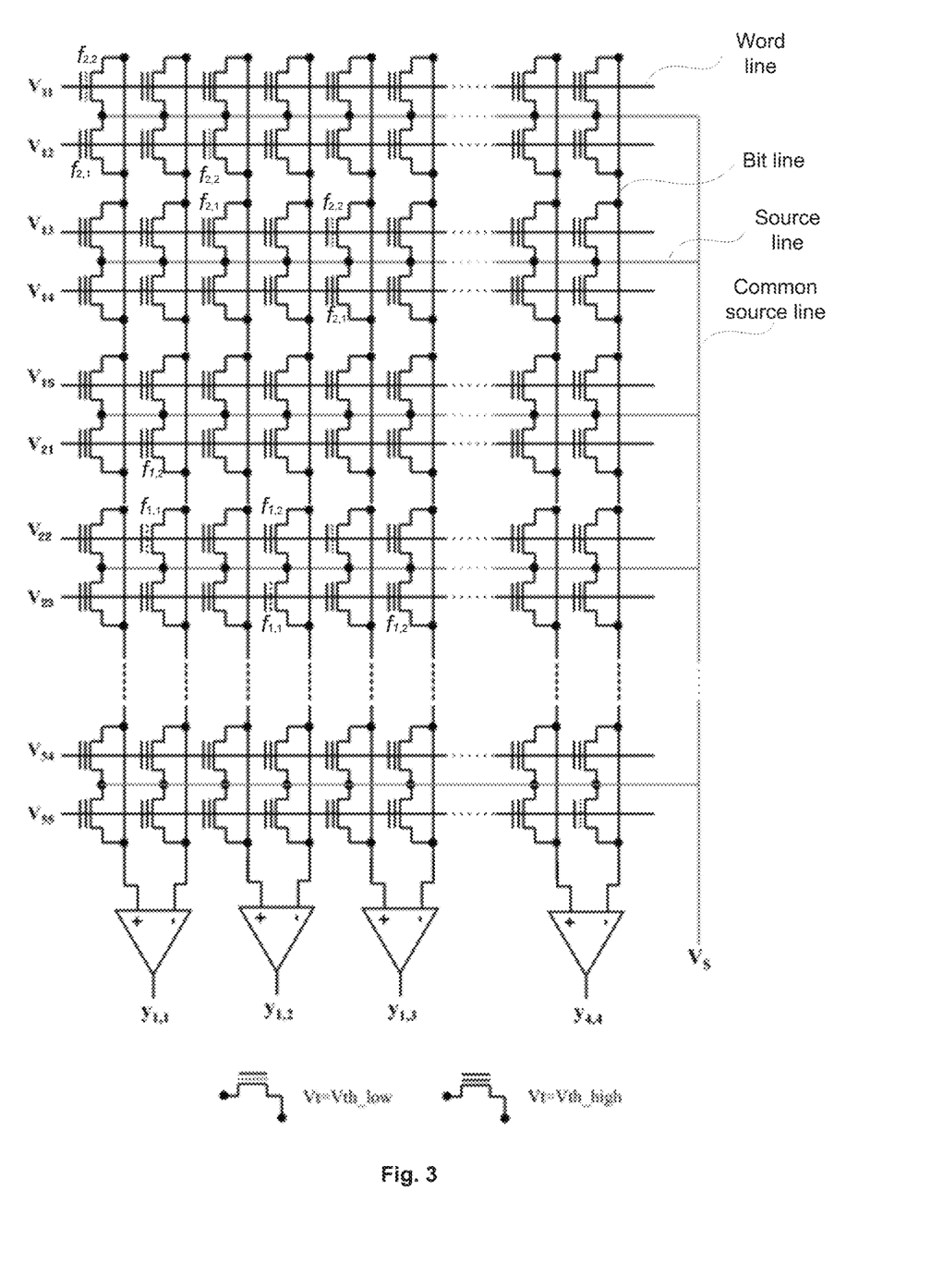
FIG. 3 is a schematic diagram of convolution calculation using an NOR flash array according to an embodiment of the present disclosure.

An NOR flash array has a structure shown in FIG. 3. For a convolution operation related to a 5×5 input matrix, a 2×2 convolution kernel matrix, and a 4×4 output matrix, the NOR flash array has a structure of two-dimensional array, which is composed of NOR flash cells arranged in 25 rows and 32 columns. Here, the two-dimensional array comprises 16 groups of bit lines extending in parallel in a first direction, wherein each group of bit lines comprises two bit lines, and each bit line is connected to drain terminals of one column of 25 NOR flash cells; 25 word lines extending in parallel in a second direction crossing the first direction, wherein each word line is connected to gate terminals of one row of 32 NOR flash cells, and source terminals of various NOR flash cells are connected to one common source line via source lines; and 16 operational amplifiers, wherein each of the operational amplifiers is connected to one group of bit lines. One bit line of each group of bit lines, as a positive bit line, is connected to a positive input terminal of a corresponding operational amplifier, and the other bit line of the group of bit lines, as a negative bit line, is connected a negative input terminal of the operational amplifier.

Elements of the convolution kernel matrix are stored in the NOR flash cells, elements of the input matrix are converted into voltages to be applied to gate terminals via word lines, a driving voltage is applied to a common source terminal of the NOR flash array, and current is collected via drain terminals for the convolution operation. Multiplication operations in the convolution operation are performed by various NOR flash cells, and current on the same bit line is aggregated together for an addition operation in the convolution operation. One end of each of the bit lines is connected to a corresponding operational amplifier, and the aggregated current is converted into an output result. Since the convolution kernel matrix usually has negative elements, two columns of mutually parallel NOR flash cells are required for each element of the output matrix. One of two bit lines is used as a positive output line, to corresponding write positive elements of the convolution kernel matrix into NOR flash cells connected to the bit line, and is connected to a positive input terminal of a corresponding operational amplifier, and the other of the two bit lines is used as a negative output line, to correspondingly write negative elements of the convolution kernel matrix into NOR flash cells connected to the bit line, and is connected to a negative input terminal of the operational amplifier. Drain terminals of the two respective columns of NOR flash cells are connected to two input terminals of the operational amplifier respectively via the bit lines respectively, so that an output of the operational amplifier is positively proportional to a sum of positive current and negative current, and a convolution operation using a convolution kernel matrix having negative elements is realized by current difference. The above is only an example. In practical applications, the input matrix and the convolution kernel matrix may be expanded to matrices of any size. Accordingly, the NOR flash array should be expanded to a scale which fits the input matrix and the convolution kernel matrix.

Figure 4:
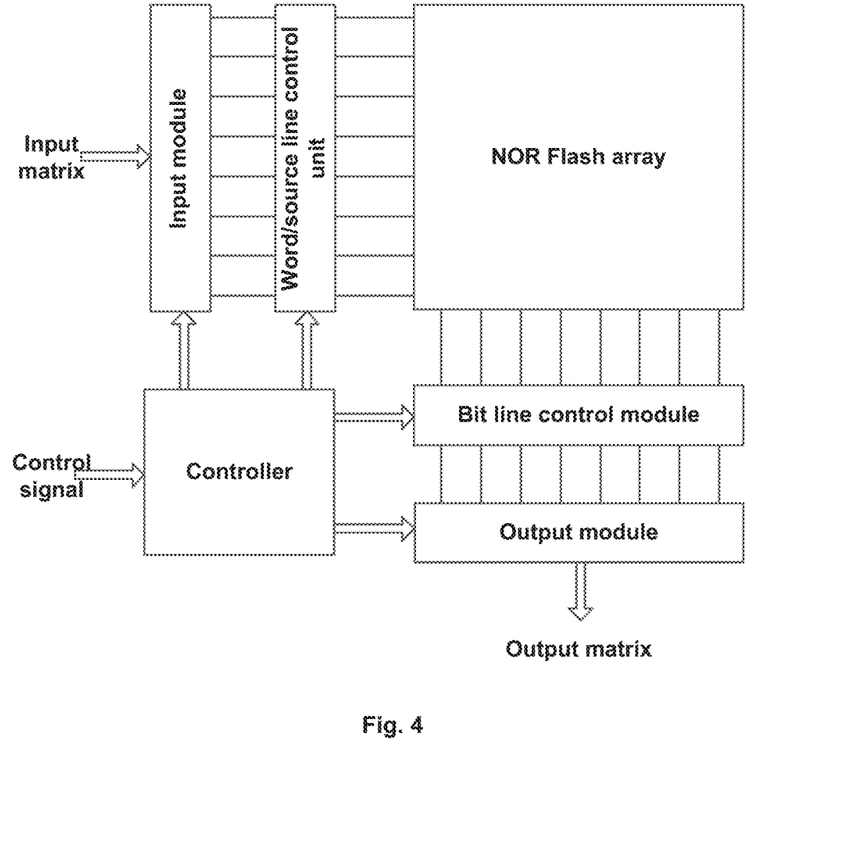
FIG. 4 is a schematic diagram of a convolution operation device based on an NOR flash array according to an embodiment of the present disclosure.

FIG. 4 is a convolution operation device based on an NOR flash array. The convolution operation device comprises an NOR flash array, a controller, a word/source line control unit, a bit line control unit, an input module, and an output module. Here, the word/source line control unit has one end connected to word lines and source lines of the NOR flash array, and the other end connected to the input module, and the word/source line control unit comprises a plurality of pulse generators and demultiplexers, wherein the plurality of pulse generators are connected to the word lines and the source lines, and the demultiplexers assign different voltages to different words lines or source lines; the bit line control unit has one end connected to bit lines of the NOR flash array, and the other end connected to the output module, and the bit line control unit comprises a plurality of pulse generators and demultiplexers, wherein the pulse generators are connected to the bit lines, and the demultiplexers can assign different voltage to bit lines or connect the corresponding bit lines to the input terminals of operational amplifiers; the input module comprises a plurality of signal generators; and the output module comprises a plurality of operational amplifiers.

The controller receives a control signal to control the word/source line control unit and the bit line control unit, to implement different input and output for the word lines, the source lines and the bit lines, respectively, thereby realizing writing and convolution operations of elements of a convolution kernel matrix and switching between the two operations. Firstly, the controller controls the word/source line control unit and the bit line control unit to apply voltages to the NOR flash array for ERASE and PROGRAM operations, so that the elements of the convolution kernel matrix are written into the NOR flash array; and after the convolution kernel matrix is stored in the NOR flash array, the controller controls the input module to convert elements of an input matrix into voltage signals, and transmit the voltage signals to the word/source line control unit. The pulse generators in the word/source line control unit generate voltages to be applied to the NOR flash array via the word lines, and a driving voltage is applied to a common source line at the same time. Current output via the bit lines connected to drain terminals in the NOR flash array is processed by the operational amplifiers to obtain a convolution result.

Figure 5:
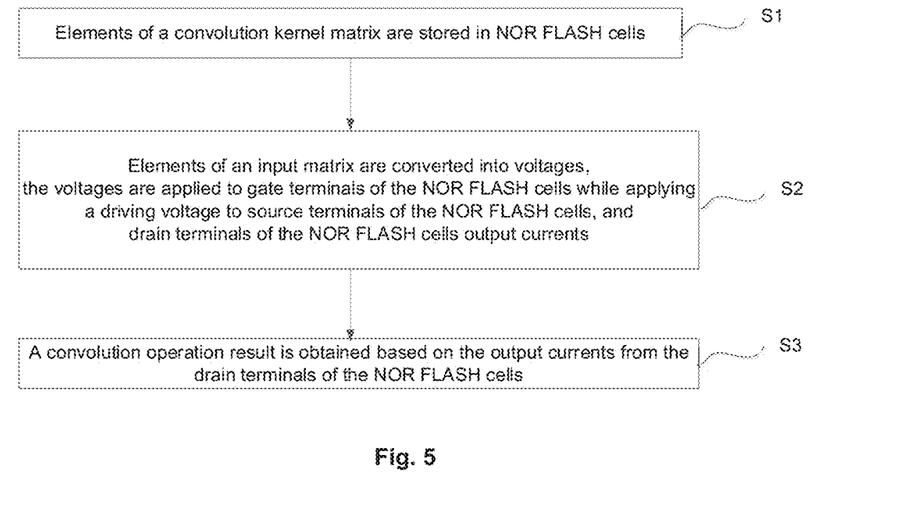
FIG. 5 is a flowchart of a convolution operation method based on an NOR flash array according to an embodiment of the present disclosure.

As shown in FIG. 5, a convolution operation method based on an NOR flash array according to an embodiment of the present disclosure comprises the following steps.

In S1, elements of a convolution kernel matrix are stored in NOR flash cells.

Under the control of a controller, voltages are applied to gate terminals, source terminals and drain terminals via word lines, a common source line and bit lines, respectively, so that values of multipliers (the elements of the convolution kernel matrix) are written into the NOR flash cells. If one of the multipliers is 1 or −1, a threshold voltage of a corresponding NOR flash cell is written to a low threshold voltage Vth_low, and if the multiplier is 0, the threshold voltage of the NOR flash cell is written to a high threshold voltage Vth_high.

In the embodiment of the present disclosure, a Roberts operator is selected as the convolution kernel. In this case, $f_{1,1}=-1$, $f_{1,2}=0$, $f_{2,1}=0$, and $f_{2,2}=1$, and values of the Roberts operator are written into the NOR flash array as shown in FIG. 3.

In a case where there are negative elements in the convolution kernel matrix, each group of two bit lines may be connected to one operational amplifier to realize calculation of a convolution kernel in a real number domain. A specific rule is as follows. One of the two bit lines is used as a positive output line, to correspondingly write positive elements of the convolution kernel matrix into NOR flash cells connected to the bit line bit-wisely, and the bit line is connected to a positive input terminal of the operational amplifier. As shown in FIG. 3, $f_{2,2}$ is written into an NOR flash cell at an crosspoint between a bit line connected to a "+" terminal of the operational amplifier corresponding to $y_{1,1}$ and a word line corresponding to $V_{11}$. The other of the two bit lines is used as a negative output line, to correspondingly write negative elements in the convolution kernel matrix into NOR flash cells connected to the bit line bit-wisely, and the bit line is connected to a negative input terminal of the operational amplifier. As shown in FIG. 3, $f_{1,1}$ is written into an NOR flash cell at the crosspoint between a bit line connected to a "−" terminal of the operational amplifier corresponding to $y_{1,1}$ and a word line corresponding to $V_{22}$. In this way, an output of the operational amplifier is positively proportional to a sum of positive current and negative current, and calculation of the convolution kernel in the real number field can be realized.

In the embodiment of the present disclosure, when the Roberts operator is used as the convolution kernel matrix for calculation, an element $y_{i,j}$ in an output matrix may be calculated according to a formula $y_{i,j}=x_{i,j}-x_{i+1,j+1}$.

In S2, elements of an input matrix are converted into voltages to be applied to gate terminals of the NOR flash cells while applying a driving voltage to source terminals, and drain terminals of the NOR flash cells output current.

In the embodiment of the present disclosure, the input matrix is a 5×5 matrix, and each element in the input matrix is represented by $x_{i,j}$. The input matrix is converted into voltage values which are input to the gate terminals of the NOR flash cells shown in FIG. 3 via word lines. Magnitude of an input voltage corresponding to the element $x_{i,j}$ is represented by $V_{ij}$.

When a multiplication operation is implemented, the input matrix is expanded in one dimension, and 25 voltages having magnitude of $V_{11}$ to $V_{55}$, which represent the elements of the input matrix, are input to 25 parallel word lines respectively. If an element of the input matrix is 1, $V_{ij}$ is taken as (Vth_high+Vth_low)/2; and if the element of the input matrix is 0, $V_{ij}$ is 0.

At the same time, a driving voltage $V_S$ is applied to a common source terminal, and an operation result is judged according to magnitude of output current of the NOR flash cells. If a multiplier is 1 or −1, i.e., a threshold voltage of a corresponding NOR flash cell is a low threshold voltage Vth_low, and a multiplicand is 1, i.e., $V_{ij}$ is (Vth_high+Vth_low)/2, the NOR flash cell is in a turn-on state, and output current at a corresponding drain terminal is large, which indicates that an output result is 1 or −1; and in a case where the multiplier is 0 or the multiplicand is 0, the NOR flash cell is in a turn-off state, and the output current at the drain terminal is small, which indicates that the output result is 0.

In S3, a convolution operation result is obtained according to the output current at the drain terminals of the NOR flash cells.

The output current at the drain terminals of the NOR flash cells is aggregated to operational amplifiers via bit lines, and values at output terminals of the operational amplifier constitute an output matrix to obtain the convolution operation result.

An operational amplifier is used to collect current values of two columns of bit lines, i.e., positive and negative bit lines, corresponding to an element $y_{1,1}$ of the output matrix. Current output by NOR flash cells on a column where positive elements of the convolution kernel are located is input to a "+" terminal of the operational amplifier, and current output by NOR flash cells on a column where negative elements of the convolution kernel are located is input to a "−" terminal of the operational amplifier. Values at output terminals of the amplifiers constitute an output matrix. For of the output matrix, a value thereof is $x_{1,1} \cdot f_{2,2} + x_{1,2} \cdot f_{2,1} + x_{2,1} \cdot f_{1,2} + x_{2,2} \cdot f_{1,1}$, wherein $f_{1,1} = -1$, $f_{1,2} = 0$, $f_{2,1} = 0$, and $f_{2,2} = 1$. Therefore, an NOR flash cell at the crosspoint between a bit line connected to the "+" terminal of the operational amplifier which outputs $y_{11}$ and a word line corresponding to $V_{11}$ is written to a Vth_low state. For simplification of the description, this cell is defined as cell 1. An NOR flash cell at the crosspoint between a bit line connected to the "−" terminal of the amplifier which outputs and a word line corresponding to $V_{22}$ is written to a Vth_low state. This cell is defined as cell 2. Other NOR flash cells connected to the amplifier which outputs $y_{1,1}$ are written to a Vth_high state. In a convolution operation, since input voltages representing the input matrix are either 0 or (Vth_high+Vth_low)/2, other cells connected to the amplifier which outputs $y_{1,1}$, except for the cells 1, 2, are always in a turn-off state. Whether the cells 1, 2 are turned on is determined according to values of $x_{1,1}$ and $x_{2,2}$ in the input matrix. If the values of $x_{1,1}$ and $x_{2,2}$ are 1, the corresponding cells 1 and 2 are turned on; if the value of $x_{1,1}$ or $x_{2,2}$ is 0, the corresponding cells 1 and 2 are turned off. According to a principle of a current differential current amplifier, $y_{1,1}$ which is output by the amplifier may be expressed as $x_1 f_{2,2} + x_{1,2} \cdot f_{2,1} + +x_{2,1} \cdot f_{1,2} + x_{2,2} \cdot f_{1,1}$, wherein $f_{1,1} = -1$, $f_{1,2} = 0$, $f_{2,1} = 0$ and $f_{2,2} = 1$, thus implementing a convolution operation. For other elements in the output matrix, the same principle is applied, and $y_{1,1}$ to $y_{4,4}$ can be obtained. The elements in the output matrix may be encoded and arranged to obtain the output matrix as shown in FIG. 1.

In practical scene applications, there are many matrices on which the same convolution operation needs to be performed. In this case, if a matrix convolution operation is completed once, a matrix on which the convolutional calculation needs to be performed may be continuously input, without inputting a new convolution kernel. Only when different types of convolution operations need to be performed on the matrices, the convolution kernel is changed. If different convolution operations need to be performed on the same matrix in practical scene applications, multiple NOR flash arrays may be used to write corresponding convolution kernels therein, then an operation matrix is input into the multiple NOR flash arrays at the same time, and operation results are output at the same time, to realize parallel calculation, thereby further improving the operational efficiency.

With the above embodiments, the convolution operation method and device based on an NOR flash array realizes multiplication calculation by using an NOR flash structure, realizes a convolution operation by using an NOR flash array, and realizes parallel and efficient execution of convolution operations, such that high calculation efficiency is realized, and the requirements of real-time data processing can be met.

The specific embodiments described above further illustrate the purposes, the technical solutions, and the beneficial effects of the present disclosure in detail. It is to be understood that the foregoing description is only specific embodiments of the present disclosure, and is not intended to limit the present disclosure. Any modification, equivalent substitution, improvement etc., which is made within the spirit and principle of the present disclosure, is intended to be included within the protection scope of the present disclosure.

The invention claimed is:

1. A convolution operation method based on an NOR flash array which is a two-dimensional array composed of a plurality of NOR flash cells, the method comprising:
   storing elements of a convolution kernel matrix into the NOR flash cells;
   applying voltages corresponding to elements of an input matrix to gate terminals of the NOR flash cells while applying a driving voltage to source terminals of the NOR flash cells, such that currents are output at drain terminals of the NOR flash cells; and
   determining a convolution operation result based on output currents from the drain terminals of the NOR flash cells.

2. The convolution operation method according to claim 1, wherein the storing of elements of a convolution kernel matrix into the NOR flash cells comprises:
   applying voltages corresponding to the elements of the convolution kernel matrix to the gate terminals, the source terminals, and the drain terminals of the NOR flash cells via word lines, a common source line, and bit lines, respectively, to write the elements of the convolution kernel matrix into the NOR flash cells.

3. The convolution operation method according to claim 2, wherein in response to an element of the convolution kernel matrix being 1 or −1, a threshold voltage of a corresponding NOR flash cell is written to a low threshold voltage; and
   wherein in response to the element of the convolution kernel matrix being 0, the threshold voltage of the corresponding NOR flash cell is written to a high threshold voltage.

4. The convolution operation method according to claim 1, wherein the applying of voltages corresponding to elements of an input matrix to gate terminals of the NOR flash cells while applying a driving voltage to source terminals of the NOR flash cells comprises,     converting the elements of the input matrix into voltages;

inputting the voltages to the gate terminals of the NOR flash cells via word lines, while the driving voltage is applied to the source terminals of the NOR flash cells via a common source line.

5. The convolution operation method according to claim 4, wherein in response to an element of the input matrix being 1, a corresponding voltage is half of a sum of a high threshold voltage and a low threshold voltage of a corresponding NOR flash cell; and     wherein in response to the element of the input matrix being 0, the voltage is 0.

6. The convolution operation method according to claim 1, wherein the determining of a convolution operation result based on output currents from the drain terminals of the NOR flash cells comprises:

aggregating the output currents from the drain terminals of the NOR flash cells to operational amplifiers via bit lines,     wherein values from output terminals of the operational amplifiers constitute an output matrix to determine the convolution operation result.

7. The convolution operation method according to claim 6, wherein output currents from drain terminals of NOR flash cells connected to a positive bit line are input to a positive input terminal of a corresponding operational amplifier,     wherein output currents from drain terminals of NOR flash cells connected to a negative bit line are input to a negative input terminal of the operational amplifier, and     wherein a value from an output terminal of the operational amplifier is an element of the output matrix.

8. The convolution operation method according to claim 1, wherein the NOR flash array further comprises a plurality of word lines, a plurality of bit lines, and a common source line,     wherein gate terminals of each row of NOR flash cells are connected via a corresponding word line,     wherein drain terminals of each column of NOR flash cells are connected via a corresponding bit line, and     wherein source terminals of the NOR flash cells are connected via one common source line.

9. The convolution operation method according to claim 8, wherein the NOR flash array further comprises: a plurality of source lines,     wherein source terminals of each row of NOR flash cells being connected via a corresponding source line, and each of the source lines is connected to the common source line.

10. The convolution operation method according to claim 1, wherein the input matrix has a size of m×m, the convolution kernel matrix has a size of n×n, and the obtained output matrix has a size of (m−n+1)×(m−n+1).

11. A convolution operation device, comprising:

a NOR flash array which is a two-dimensional array composed of a plurality of NOR flash cells, and     a plurality of operational amplifiers,     wherein each of the NOR flash cells has a gate terminal, a source terminal, and a drain terminal, the gate terminals of the NOR flash cells in a same row of the NOR flash array being connected to a same word line, the drain terminals of the NOR flash cells in a same column of the NOR flash array being connected to a same bit line, and the source terminals of all the NOR flash cells being connected to a common source line,     wherein each of the operational amplifiers has a positive input terminal connected to a positive bit line and a negative input terminal connected to a negative bit line,     wherein the convolution operation device is operative to perform a convolution operation method based on a NOR flash array which is a two-dimensional array composed of a plurality of NOR flash cells, the method comprising:

storing elements of a convolution kernel matrix into the NOR flash cells;

applying voltages corresponding to elements of an input matrix to gate terminals of the NOR flash cells while applying a driving voltage to source terminals of the NOR flash cells, such that currents are output at drain terminals of the NOR flash cells; and determining a convolution operation result based on output currents from the drain terminals of the NOR flash cells.

\* \* \* \* \*